United States Patent
Wang et al.

(10) Patent No.: US 12,327,119 B2
(45) Date of Patent: Jun. 10, 2025

(54) LOGIC CIRCUIT AND METHOD FOR CHECKING AND UPDATING PROGRAM COUNTER VALUES IN PIPELINE ARCHITECTURE BY COMPARING PC VALUES OF CONSECUTIVE CYCLES

(71) Applicant: Realtek Semiconductor Corp., HsinChu (TW)

(72) Inventors: Chen-Hsing Wang, HsinChu (TW); Yu-Ju Shih, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 50 days.

(21) Appl. No.: 18/139,914

(22) Filed: Apr. 26, 2023

(65) Prior Publication Data
US 2023/0350686 A1 Nov. 2, 2023

(30) Foreign Application Priority Data
Apr. 29, 2022 (TW) .................................. 111116417

(51) Int. Cl.
*G06F 9/32* (2018.01)
(52) U.S. Cl.
CPC .................................. *G06F 9/322* (2013.01)
(58) Field of Classification Search
CPC ........ G06F 9/322; G06F 9/321; G06F 9/3861; G06F 11/0721; G06F 9/3842; G06F 9/3867; H03K 19/20
See application file for complete search history.

(56) References Cited

U.S. PATENT DOCUMENTS

| | | | | |
|---|---|---|---|---|
| 5,293,613 A | * | 3/1994 | Hayden | G06F 9/3863 712/228 |
| 5,668,973 A | * | 9/1997 | Stutz | G07B 17/00193 365/189.16 |
| 6,263,428 B1 | | 7/2001 | Nonomura | |
| 6,658,621 B1 | * | 12/2003 | Jamil | G06F 9/3861 712/42 |
| 2001/0025338 A1 | * | 9/2001 | Zumkehr | G06F 11/1405 714/21 |
| 2009/0113240 A1 | * | 4/2009 | Vera | G06F 11/1497 714/E11.178 |
| 2009/0150653 A1 | * | 6/2009 | Monferrer | G06F 11/1008 712/217 |

(Continued)

FOREIGN PATENT DOCUMENTS

TW    202105177 A    2/2021

*Primary Examiner* — Keith E Vicary
(74) *Attorney, Agent, or Firm* — Winston Hsu (57) ABSTRACT

A logic circuit and a method for checking and updating program counter (PC) values in a pipeline architecture are provided. The logic circuit includes a checking circuit and a PC value determination circuit. The checking circuit checks a continuity of a current PC value and multiple flags related to a branch predictor, in order to generate a checking result, where the branch predictor is configured to control the multiple flags according to the current PC value. The PC value determination circuit selects one of multiple candidate PC values to be a subsequent PC value according to the checking result, where the current PC value corresponds to a current instruction, and the subsequent PC value corresponds to a subsequent instruction after the current instruction.

16 Claims, 4 Drawing Sheets

(56) References Cited

U.S. PATENT DOCUMENTS

| | | | | |
|---|---|---|---|---|
| 2009/0249301 A1* | 10/2009 | Kalla | .................. | G06F 11/3668 |
| | | | | 717/127 |
| 2010/0131796 A1* | 5/2010 | Engelbrecht | .......... | G06F 9/3812 |
| | | | | 711/119 |
| 2019/0378542 A1* | 12/2019 | Didehban | ........... | G06F 11/0793 |

* cited by examiner

LOGIC CIRCUIT AND METHOD FOR CHECKING AND UPDATING PROGRAM COUNTER VALUES IN PIPELINE ARCHITECTURE BY COMPARING PC VALUES OF CONSECUTIVE CYCLES

BACKGROUND OF THE INVENTION

1. Field of the Invention

The present invention is related to branch prediction in pipeline architecture, and more particularly, to a logic circuit and a method for checking and updating program counter values in pipeline architecture.

2. Description of the Prior Art

When a central processing unit (CPU) receives a branch instruction in a typical pipeline architecture, if branch prediction is not performed, [to] the CPU must wait for the branch instruction to enter an instruction execution stage in order to know whether a next instruction needs to jump to a branch target instruction different from a default sequential instruction; operation efficiency of the pipeline architecture is therefore limited. In order to improve the efficiency of the pipeline architecture when processing the branch instruction, a branch predictor is typically utilized to predict the branch target instruction of the branch instruction in an instruction fetch stage, which allows the branch target instruction following the branch instruction to be able to enter the pipeline architecture in advance.

In a related art, a static random access memory (SRAM) of the CPU may utilize Single-Error-Correction-Double-Error-Detection (SEC-DED) hamming code to implement error correction codes. When a prediction result of the branch predictor has a transient error due to soft error, however, this transient error (e.g. a multi-bit error) is not able to be corrected or detected by the SEC-DED, and therefore the CPU will be unable to normally operate.

Thus, there is a need for a novel check mechanism to check the order of instruction execution without greatly increasing additional costs, and properly perform correction when any error is detected.

SUMMARY OF THE INVENTION

An objective of the present invention is to provide a logic circuit and a method that can check and update program counter (PC) values in a pipeline architecture, to solve the problem of the related art without introducing any side effect or in a way that is less likely to introduce side effects.

At least one embodiment of the present invention provides a logic circuit for checking and updating program counter (PC) values in a pipeline architecture. The logic circuit may comprise a checking circuit and a PC value determination circuit coupled to the checking circuit. The checking circuit is configured to check a continuity of a current PC value and multiple flags related to a branch predictor in order to generate a checking result, wherein the branch predictor is configured to control the multiple flags according to the current PC value. The PC value determination circuit is configured to select one of multiple candidate PC values to be a subsequent PC value according to the checking result. More particularly, the current PC value corresponds to a current instruction, and the subsequent PC value corresponds to a subsequent instruction after the current instruction.

At least one embodiment of the present invention provides a method for checking and updating PC values in a pipeline architecture, wherein the method is applicable to a logic circuit. The method may comprise: utilizing a checking circuit of the logic circuit to check a continuity of a current PC value and multiple flags related to a branch predictor in order to generate a checking result, wherein the branch predictor is configured to control the multiple flags according to the current PC value; and utilizing a PC value determination circuit of the logic circuit to select one of multiple candidate PC values to be a subsequent PC value according to the checking result. More particularly, the current PC value corresponds to a current instruction, and the subsequent PC value corresponds to a subsequent instruction after the current instruction.

The logic circuit and the method provided by the embodiments of the present invention can detect abnormalities of the PC values or the flags when any soft error occurs, and solve the problem caused by the soft error via control of subsequent PC values (e.g. by repeatedly executing the instruction corresponding to the same PC value). In comparison with the related art, the embodiment of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
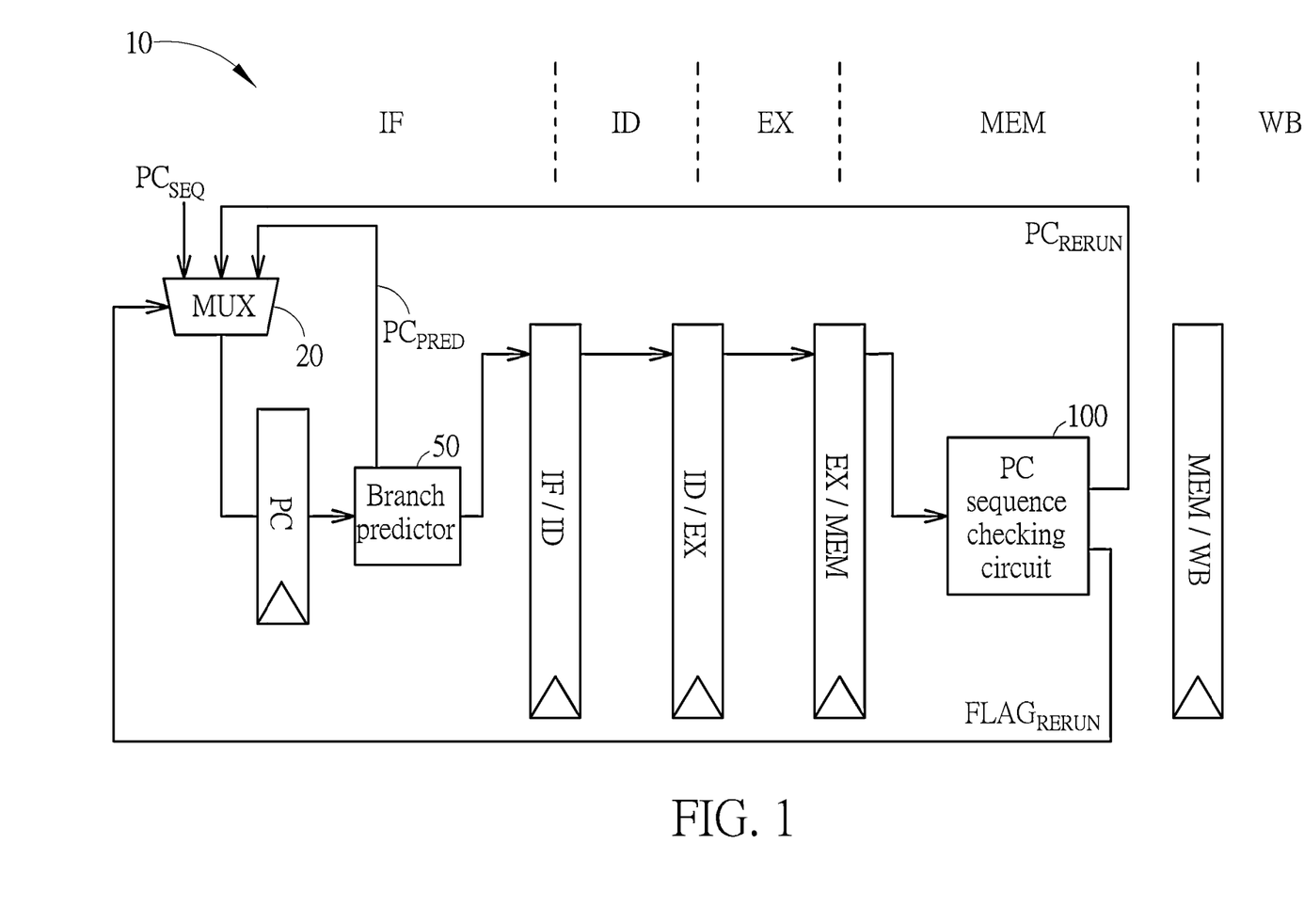
FIG. 1 is a diagram illustrating an apparatus operating under instruction pipeline architecture according to an embodiment of the present invention.

FIG. 1 is a diagram illustrating an apparatus 10 such as a central processing unit (CPU) operating under an instruction pipeline architecture according to an embodiment of the present invention. In this embodiment, the architecture of the instruction pipeline may be a five-stage pipeline, which comprises an instruction fetch stage, an instruction decode stage, an instruction execution stage, a memory access stage and a data write-back stage, where the above stages are labeled "IF", "ID", "EX", "MEM" and "WB" in the figures for brevity, and there are corresponding interfaces laid between respective stages, where these interfaces are respectively labeled "IF/ID", "[ID/EXE] ID/EX", "EX/MEM" and "MEM/WB" in the figures for brevity.

The apparatus 10 may utilize a program counter (PC) to indicate a position of an instruction in a program sequence that is executed by the CPU, where different PC values may correspond to different instructions. As shown in FIG. 1, the apparatus 10 may comprise a multiplexer (MUX) 20, a branch predictor 50 and a logic circuit such as a PC sequence checking circuit 100. In the instruction fetch stage, the branch predictor 50 may perform branch prediction according to a received PC value: for example, determining whether the PC value corresponds to a branch instruction, predicting whether the branch instruction is taken to jump to a certain branch target instruction, and predicting a target PC value such as a PC value $PC_{PRED}$ of instruction jump. In some embodiments, the branch predictor 50 may comprise a branch target buffer (BTB) and a branch taken prediction circuit, where the BTB may be implemented with a static random access memory (SRAM), but the present invention is not limited thereto. The BTB may store PC values of branch instructions and branch targets (e.g. prediction targets) of these branch instructions, in order to predict a branch taken target of a branch instruction, and the branch taken prediction circuit may be configured to predict whether this branch instruction is taken to jump to the branch taken target. In addition, the branch predictor 50 may transmit prediction results to the PC sequence checking circuit 100, in order to check these prediction results in the memory access stage and accordingly generate a checking result such as a flag $FLAG_{RERUN}$.

In this embodiment, the flag $FLAG_{RERUN}$ is configured to control whether an instruction corresponding to a certain PC value is re-executed, for example, by transmitting this PC value such as $PC_{RERUN}$ back to the instruction fetch stage to re-execute the corresponding instruction. In addition, a PC value $PC_{SEQ}$ may represent a next PC value of a current PC value under a default sequence of the apparatus 10 (e.g. by adding a fixed offset value to the current PC value). In this embodiment, the MUX 20 may select one of the PC values $PC_{SEQ}$, $PC_{PRED}$ and $PC_{RERUN}$ to be a PC value for proceeding with the instruction fetch stage. For example, when a flag $FLAG_{RERUN}$ is raised (e.g. $FLAG_{RERUN}$=1), the MUX 20 may select the PC value $PC_{RERUN}$ to be the PC value for proceeding with the instruction fetch stage, and instructions and data in the pipeline at this moment can be flushed to re-execute the instruction corresponding to the PC value $PC_{RERUN}$. In another example, when the flag $FLAG_{RERUN}$ is not raised (e.g. $FLAG_{RERUN}$=0) and the prediction result of the branch predictor 50 is taken to jump to a target instruction, the MUX 20 may select the PC value $PC_{PRED}$ to be the PC value for proceeding with the instruction fetch stage. In another example, when the flag $FLAG_{RERUN}$ is not raised (e.g. $FLAG_{RERUN}$=0) and the prediction result of the branch predictor 50 is not taken to jump to the target instruction, the MUX 20 may select the $PC_{SEQ}$ to be the PC value for proceeding with the instruction fetch stage.

It should be noted that the apparatus 10 may comprise other logic circuits or operation modules (which are not shown in figures) for executing tasks of respective stages, where implementations of these logic circuits or operation modules are well known by those skilled in this art, do not substantially hinder the implementation of the present invention, and are therefore omitted here for brevity.

Figure 2:
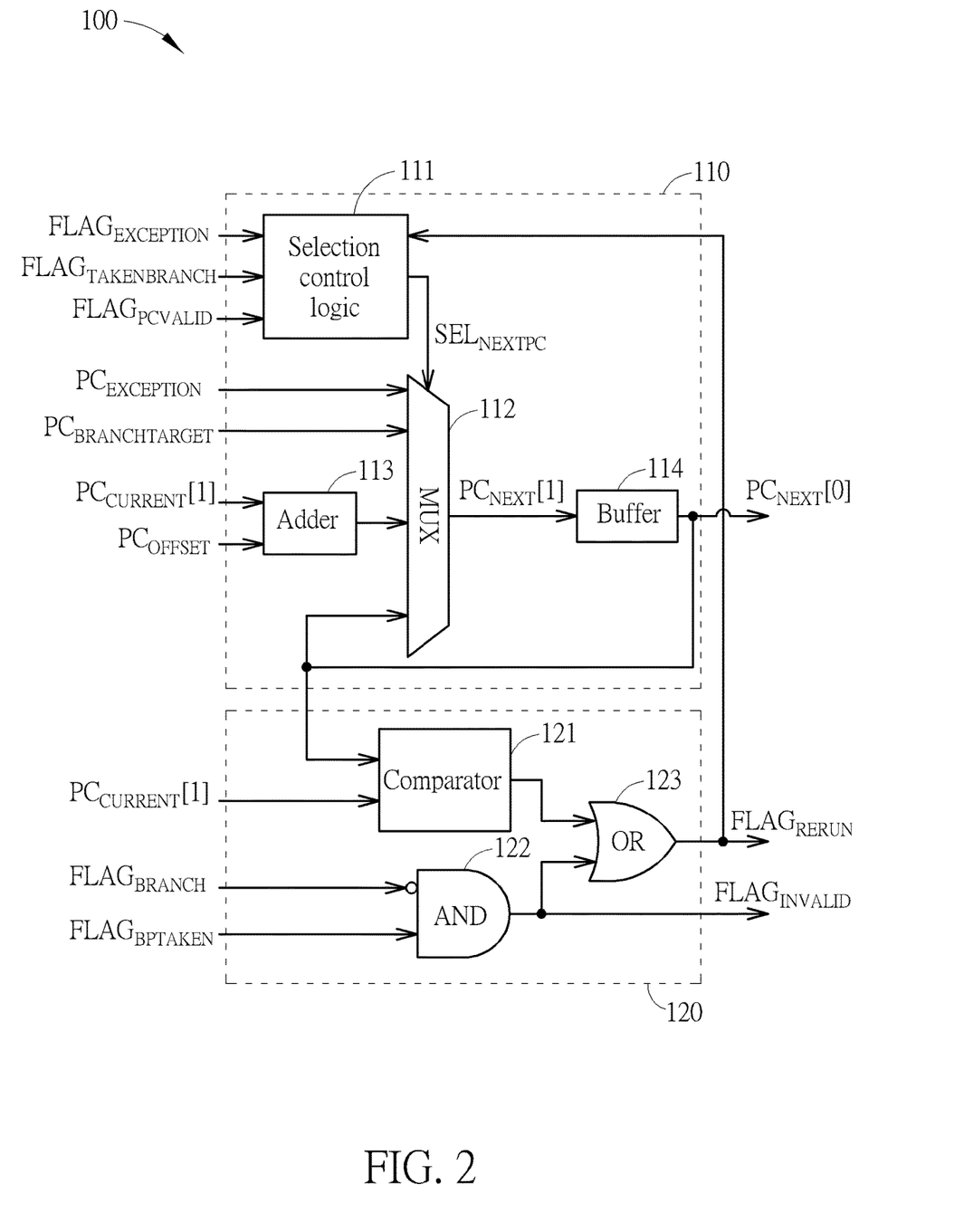
FIG. 2 is a diagram illustrating a program counter sequence checking circuit according to an embodiment of the present invention.

FIG. 2 is a diagram illustrating the PC sequence checking circuit 100 according to an embodiment of the present invention. As shown in FIG. 2, the PC sequence checking circuit 100 may comprise a PC value determination circuit 110 and a PC value checking circuit 120, wherein the PC value determination circuit 110 is coupled to the PC value checking circuit 120. In this embodiment, the PC value checking circuit 120 may be configured to check a continuity of a current PC value and multiple flags such as $FLAG_{BRANCH}$ and $FLAG_{BPTAKEN}$ related to the branch predictor 50, in order to generate a checking result such as the flag $FLAG_{RERUN}$, where the branch predictor 50 may control the flags $FLAG_{BRANCH}$ and $FLAG_{BPTAKEN}$ according to the current PC value. In addition, the PC value determination circuit 110 may be configured to select one of multiple candidate PC values to be a subsequent PC value according to the checking result such as the $FLAG_{RERUN}$. More particularly, the current PC value may correspond to a current instruction, and the subsequent PC value may correspond to a subsequent instruction after the current instruction.

In this embodiment, the PC value determination circuit 110 may comprise a selection control logic 111, a MUX 112, an adder 113 and a buffer 114 (e.g. a register). The selection control logic 111 may generate a control signal $SEL_{NEXTPC}$ according to the flags $FLAG_{RERUN}$, $FLAG_{EXCEPTION}$, $FLAG_{TAKENBRANCH}$ and $FLAG_{PCVALID}$, in order to control the MUX 112 to select one of the multiple candidate PC values to be the subsequent PC value, and the buffer 114 may output the subsequent PC value in a next cycle. It should be noted that a PC value $PC_{NEXT}[1]$ on an input terminal of the buffer 114 (e.g. an output terminal of the MUX 112) may represent a value of the subsequent PC value in a current cycle, and a PC value $PC_{NEXT}[0]$ on an output terminal of the buffer 114 may represent a value of the subsequent PC value in a previous cycle. In addition, the adder 113 may be configured to add an offset value $PC_{OFFSET}$ to a PC value $PC_{CURRENT}[1]$ to generate a sequential PC value (e.g. $PC_{CURRENT}[1]+PC_{OFFSET}$), where the offset value may be set to be a fixed value (e.g. 4, 8, 16) according to types of instructions, but the present invention is not limited thereto.

In this embodiment, the PC value checking circuit 120 may comprise a continuity detection logic such as a comparator 121, an error detection logic such as an AND gate 122 (labeled "AND" in FIG. 2) and an OR gate 123 (labeled "OR" in FIG. 2), where the OR gate 123 is coupled to the AND gate 122 and the comparator 121. The comparator 121 may be configured to generate a continuity detection result according to the PC value $PC_{CURRENT}[1]$ and the PC value $PC_{NEXT}[0]$. As the PC value $PC_{NEXT}[0]$ may represent the subsequent PC value determined by the PC value determination circuit 110 (e.g. a PC value of which the PC value determination circuit 110 expects or predicts to receive) according to values of the flags $FLAG_{RERUN}$, $FLAG_{EXCEPTION}$, $FLAG_{TAKENBRANCH}$ and $FLAG_{PCVALID}$ in the previous cycle (e.g. a last cycle of the current cycle), and the PC value $PC_{CURRENT}[1]$ is a value of the current PC value in the current cycle (e.g. a PC value that the PC sequence checking circuit 100 actually receives in the current cycle), the continuity detection result may indicate whether the PC value $PC_{CURRENT}[1]$ and the PC value $PC_{NEXT}[0]$ are identical, for determining whether a continuity of PC values in the pipeline architecture is abnormal. For example, when the continuity detection result indicates that the PC value $PC_{CURRENT}[1]$ and the PC value $PC_{NEXT}[0]$ are identical (e.g. when the continuity detection result shows a logic value "0"), it means the continuity of the PC values in the pipeline architecture is normal. In another example, when the continuity detection result indicates that the PC value $PC_{CURRENT}[1]$ and the PC value $PC_{NEXT}[0]$ are not identical (e.g. when the continuity detection result shows a logic value "1"), it means the continuity of the PC values in the pipeline architecture is abnormal.

In addition, the flag $FLAG_{BRANCH}$ may represent a branch instruction flag which indicates whether the current instruction (e.g. an instruction corresponding to the PC value $PC_{CURRENT}[1]$) is a branch instruction, and the flag $FLAG_{BPTAKEN}$ may represent a branch prediction taken flag which indicates whether the current instruction (e.g. the instruction corresponding to the PC value $PC_{CURRENT}[1]$) is taken to jump to a branch target instruction. In this embodiment, the AND gate 122 may generate an error detection result such as a flag $FLAG_{INVALID}$ according to the flags $FLAG_{BRANCH}$ and $FLAG_{BPTAKEN}$. It should be noted that there is a circle depicted on a terminal of the AND gate 122, which is configured to receive the flag $FLAG_{BRANCH}$, in order to indicate an inverting operation performed on the flag $FLAG_{BRANCH}$. Thus, when the flag $FLAG_{BRANCH}$ indicates that the current instruction is not a branch instruction (e.g. $FLAG_{BRANCH}=0$) but the flag $FLAG_{BPTAKEN}$ indicates that the current instruction is taken to jump to the branch target instruction (e.g. $FLAG_{BPTAKEN}=1$), the AND gate 122 may raise the flag $FLAG_{INVALID}$ (e.g. $FLAG_{INVALID}=1$) to indicate that an operation of the branch predictor is abnormal. In some embodiments, when the flag $FLAG_{INVALID}$ is raised, the PC sequence checking circuit 100 may invalidate an entry corresponding to the PC value $PC_{CURRENT}[1]$ in the branch predictor 50 (e.g. the BTB therein), but the present invention is not limited thereto.

In addition, the OR gate 123 may perform a logic-OR operation on the continuity detection result and the error detection result to generate the checking result such as the flag $FLAG_{RERUN}$, where when the continuity detection result indicates that the PC value $PC_{CURRENT}[1]$ and the PC value $PC_{NEXT}[0]$ are not identical, or when the flag $FLAG_{INVALID}$ indicates that the operation of the branch predictor 50 is abnormal, the flag $FLAG_{RERUN}$ can be raised (e.g. $FLAG_{RERUN}=1$).

In this embodiment, the multiple candidate PC values may comprise a PC value $PC_{EXCEPTION}$ corresponding to the flag $FLAG_{EXCEPTION}$, a PC value $PC_{BRANCHTARGET}$ corresponding to the flag $FLAG_{TAKENBRANCH}$, the sequential PC value (e.g. $PC_{CURRENT}[1]+PC_{OFFSET}$) corresponding to the flag $FLAG_{PCVALID}$, and the PC value $PC_{NEXT}[0]$ corresponding to the flag $FLAG_{RERUN}$. When the flag $FLAG_{RERUN}$ is raised, the selection control circuit 111 may control the MUX 112 to select the PC value $PC_{NEXT}[0]$ to be the PC value $PC_{NEXT}[1]$, and output the PC value $PC_{NEXT}[1]$ to be the PC value $PC_{RERUN}$ shown in FIG. 1, to re-execute the subsequent instruction corresponding to the PC value $PC_{NEXT}[0]$.

When the flag $FLAG_{RERUN}$ is not raised, it means the continuity of the current PC value and the multiple flags (such as $FLAG_{BRANCH}$ and $FLAG_{BPTAKEN}$) are normal, and the PC value determination circuit 110 may select one of the multiple candidate PC values to be the subsequent PC value further according to multiple event flags. In this embodiment, the multiple event flags may comprise an exception event flag such as the flag $FLAG_{EXCEPTION}$, a taken branch flag such as the flag $FLAG_{TAKENBRANCH}$ and a PC valid flag such as the flag $FLAG_{PCVALID}$. For example, the PC value determination circuit 110 may determine whether to select the PC value $PC_{EXCEPTION}$ to be the PC value $PC_{NEXT}[1]$ according to the flag $FLAG_{EXCEPTION}$, where when an interrupt event occurs in operations of the apparatus 10, the flag $FLAG_{EXCEPTION}$ may be raised, and the PC value $PC_{EXCEPTION}$ may represent a target PC value at which the apparatus 10 is taken to jump to by default when the interrupt event occurs, to make the apparatus 10 execute a default subsequent instruction in response to the interrupt event, but the present invention is not limited thereto. In another example, when the flag $FLAG_{EXCEPTION}$ is not raised, the PC value determination circuit 110 may determine whether to select the PC value $PC_{BRANCHTAKEN}$ to be the PC value $PC_{NEXT}[1]$ according to the flag $FLAG_{TAKENBRANCH}$, where when the branch predictor 50 determines that the PC value $PC_{NEXT}[1]$ corresponds to a branch instruction and is taken to jump to a branch target instruction, the flag $FLAG_{TAKENBRANCH}$ may be raised, and the PC value $PC_{BRANCHTAKEN}$ may represent the target PC value in response to the branch instruction being taken to jump, but the present invention is not limited thereto. In another example, when the flags $FLAG_{EXCEPTION}$ and $PC_{BRANCHTAKEN}$ are not raised, the PC value determination circuit 110 may determine whether to select the sequential PC value (e.g. $PC_{CURRENT}[1]+PC_{OFFSET}$) to be the PC value $PC_{NEXT}[1]$ according to the flag $FLAG_{PCVALID}$, where when it is confirmed that the PC value $PC_{CURRENT}[1]$ corresponds to a valid instruction (e.g. a typical sequential instruction) after being processed in the instruction decode stage, the flag $FLAG_{PCVALID}$ may be raised to make the PC value $PC_{NEXT}[1]$ be set to $PC_{CURRENT}[1]+PC_{OFFSET}$, but the present invention is not limited thereto.

It should be noted that when a flag corresponding to a certain PC value is detected to be abnormal (e.g. when the flag $FLAG_{INVALID}$ is raised), the PC sequence checking circuit 100 does not have to immediately invalidate an entry corresponding to this PC value in the branch predictor 50 (e.g. the BTB therein). For example, when the branch predictor 50 makes the flags $FLAG_{BRANCH}$ and $FLAG_{BPTAKEN}$ corresponding to the PC value $PC_{CURRENT}[1]$ have transient abnormalities due to soft error, the PC sequence checking circuit 100 may solve the problem of the transient abnormalities mentioned above by re-executing the instruction corresponding to the PC value $PC_{CURRENT}[1]$. In some embodiments, the PC sequence checking circuit 100 may further comprise a counter to count a number of times the instruction corresponding to the PC value $PC_{CURRENT}[1]$ is re-executed in order to generate a counting result, where when the counting result is less than a predetermined threshold, the PC sequence checking circuit 100 may make the entry corresponding to the PC value $PC_{CURRENT}[1]$ in the branch predictor 50 (e.g. the BTB therein) be kept at a valid status. When the counting result reaches (or is greater than) the predetermined threshold, the PC sequence checking circuit 100 may invalidate the entry corresponding to the PC value $PC_{CURRENT}[1]$ in the branch predictor 50 (e.g. the BTB therein), but the present invention is not limited thereto.

Figure 3:
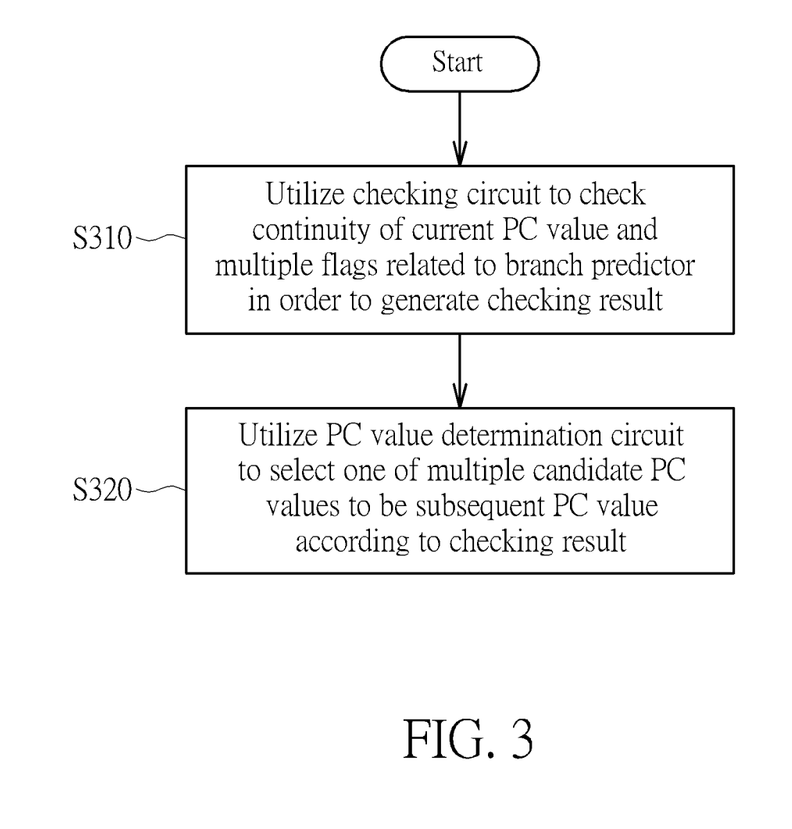
FIG. 3 is a diagram illustrating a working flow of a method for checking and updating program counter values in a pipeline architecture according to an embodiment of the present invention.

FIG. 3 is a diagram illustrating a working flow of a method for checking and updating PC values in a pipeline architecture according to an embodiment of the present invention, where the method is applicable to a logic circuit such as the PC sequence checking circuit 100 shown in FIG. 2. It should be noted that one or more steps may be added, deleted or modified in the working flow shown in FIG. 3. In addition, as long as an overall result is not hindered, these steps do not have to be executed in the exact order shown in FIG. 3.

In Step S310, the logic circuit may utilize a checking circuit thereof (e.g. the PC value checking circuit 120) to check a continuity of a current PC value and multiple flags related to a branch predictor in order to generate a checking result, wherein the branch predictor is configured to control the multiple flags according to the current PC value.

In Step S320, the logic circuit may utilize a PC value determination circuit thereof (e.g. the PC value determination circuit 110) to select one of multiple candidate PC values to be a subsequent PC value according to the checking result, wherein the current PC value corresponds to a current instruction, and the subsequent PC value corresponds to a subsequent instruction after the current instruction.

Figure 4:
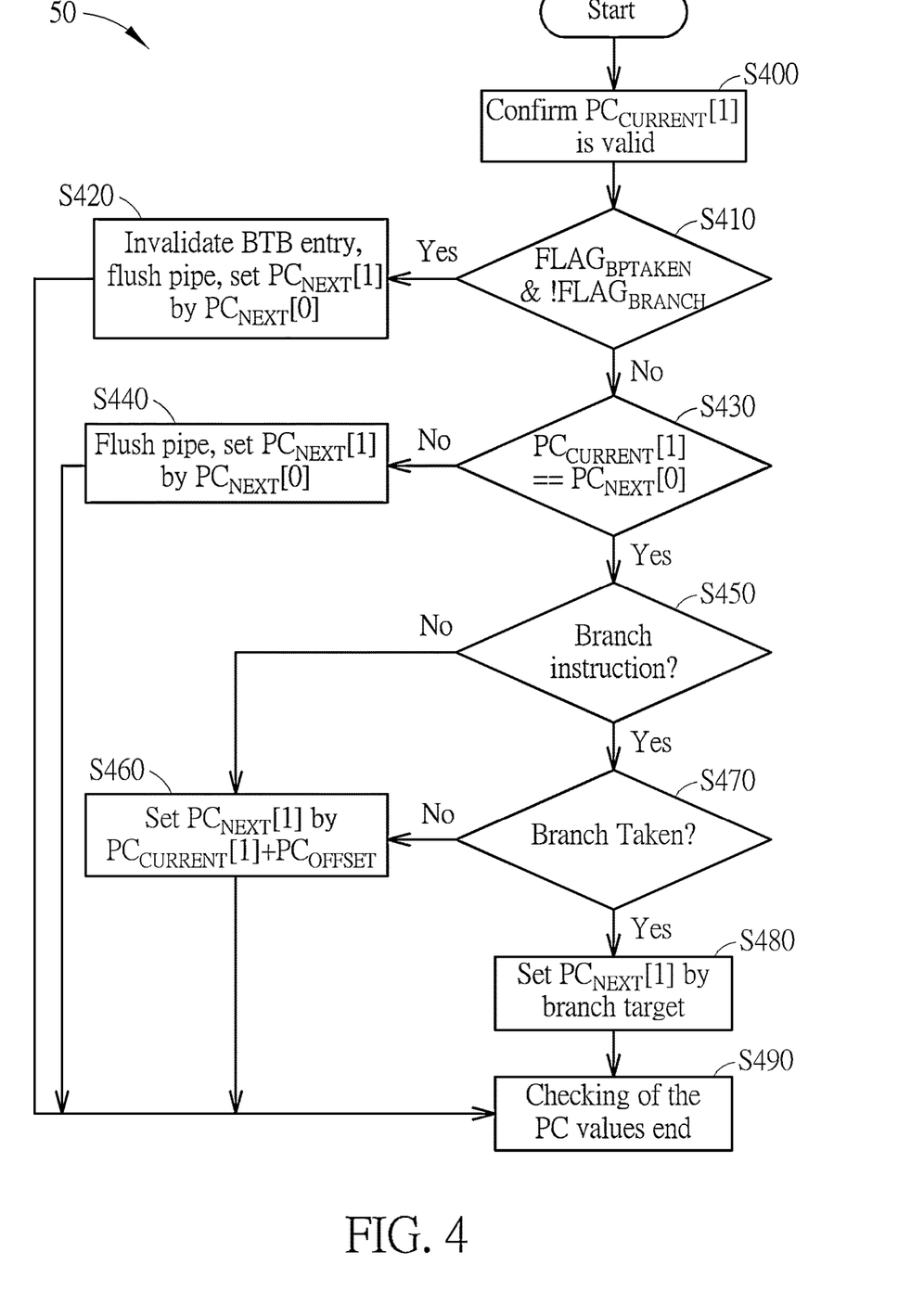
FIG. 4 is a diagram illustrating details of the method shown in FIG. 3 according to an embodiment of the present invention.

FIG. 4 is a diagram illustrating some details of the method according to an embodiment of the present invention, where the working flow shown in FIG. 4 may be executed by the PC sequence checking circuit 100 shown in FIG. 2. It should be noted that one or more steps may be added, deleted or modified in the working flow shown in FIG. 4. In addition, as long as an overall result is not hindered, these steps do not have to be executed by the exact order shown in FIG. 4.

In Step S400, the flow starts, and the PC sequence checking circuit 100 may check whether the PC sequence $PC_{CURRENT}[1]$ is valid (e.g. by confirming the flag $FLAG_{PCVALID}$). After it is confirmed that the PC value $PC_{CURRENT}[1]$ is valid, the flow proceeds with Step S410.

In Step S410, the PC sequence checking circuit 100 may check whether a condition of the flag $FLAG_{BPTAKEN}$ being raised and the flag $FLAG_{BRANCH}$ being not raised (labeled "$FLAG_{BPTAKEN}$ & !$FLAG_{BRANCH}$" in FIG. 4 for brevity) is satisfied. If the checking result of this step shows "Yes", the flow proceeds with Step S420; and if the checking result of this step shows "No", the flow proceeds with Step S430.

In Step S420, the PC sequence checking circuit 100 may invalidate the entry corresponding to the PC value $PC_{CURRENT}[1]$ in the branch predictor 50 (e.g. the BTB therein), then flush instructions and data in the pipeline, and select the PC value $PC_{NEXT}[0]$ to be the PC value $PC_{NEXT}[1]$ (labeled "Invalidate BTB entry, flush pipe, set $PC_{NEXT}[1]$ by $PC_{NEXT}[0]$" in FIG. 4 for brevity).

In Step S430, the PC sequence checking circuit 100 may check whether the PC value $PC_{CURRENT}[1]$ and the PC value $PC_{NEXT}[0]$ are identical (labeled "$PC_{CURRENT}[1]==PC_{NEXT}[0]$" in FIG. 4 for brevity). If the checking result of this step shows "Yes", the flow proceeds with Step S450; and if the checking result of this step shows "No", the flow proceeds with Step S440.

In Step S440, the PC sequence checking circuit 100 may flush instructions and data in the pipeline, and select the PC value $PC_{NEXT}[0]$ to be the PC value $PC_{NEXT}[1]$ (labeled "Flush pipe, set $PC_{NEXT}[1]$ by $PC_{NEXT}[0]$" in FIG. 4 for brevity).

In Step S450, the PC sequence checking circuit 100 may check whether the PC value $PC_{CURRENT}[1]$ corresponds to a branch instruction (labeled "Branch instruction?" in FIG. 4 for brevity). If the checking result of this step shows "Yes", the flow proceeds with Step S470; and if the checking result of this step shows "No", the flow proceeds with Step S460.

In Step S460, the PC sequence checking circuit 100 may confirm that the PC value $PC_{CURRENT}[1]$ corresponds to a typical instruction, and select the sequential PC value (e.g. $PC_{CURRENT}[1]+PC_{OFFSET}$) to be the PC value $PC_{NEXT}[1]$ (labeled "Set $PC_{NEXT}[1]$ by $PC_{CURRENT}[1]+PC_{OFFSET}$" in FIG. 4 for brevity).

In Step S470, the PC sequence checking circuit 100 may check whether the branch instruction corresponding to the PC value $PC_{CURRENT}[1]$ is taken to jump to a branch target instruction (labeled "Branch Taken?" in FIG. 4 for brevity). If the checking result of this step shows "Yes", the flow proceeds with Step S480; and if the checking result of this step shows "No", the flow proceeds with Step S460.

In Step S480, the PC sequence checking circuit 100 may select a target PC value such as $PC_{BRANCHTAKEN}$, which is predicted by the branch predictor 50, to be the PC value $PC_{NEXT}[1]$ (labeled "Set $PC_{NEXT}[1]$ by branch target" in FIG. 4 for brevity).

In Step S490, checking of the PC values end.

To summarize, the present invention checks multiple flags related to the branch predictor 50 and the continuity of the PC values in the memory access stage by the PC sequence checking circuit 100, in order to determine how to update the subsequent PC value. When an abnormality of related flags or the continuity of the PC values is detected, the present invention can control the pipeline architecture to re-execute the instruction corresponding to the abnormal PC value by a corresponding subsequent PC value update mechanism, thereby solving the problem of transient abnormalities caused by soft errors. In comparison with the related art, the embodiment of the present invention will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A logic circuit for checking and updating program counter (PC) values in a pipeline architecture by comparing PC values of consecutive cycles, comprising:
   a checking circuit, configured to check a continuity of a current PC value and multiple flags related to a branch predictor in order to generate a checking result, wherein the branch predictor is configured to control the multiple flags according to the current PC value; and
   a PC value determination circuit, coupled to the checking circuit, configured to select one of multiple candidate PC values to be a subsequent PC value according to the checking result;
   wherein the current PC value corresponds to a current instruction, and the subsequent PC value corresponds to a subsequent instruction after the current instruction; and
   wherein the checking circuit checks the continuity of the current PC value by checking whether a value of the current PC value in a current cycle is identical to a value of the subsequent PC value in a previous cycle.

2. The logic circuit of claim 1, wherein the checking circuit comprises:
   a continuity detection logic circuit, configured to generate a continuity detection result according to the current PC value and the subsequent PC value, wherein the continuity detection result indicates whether the value of the current PC value in the current cycle is identical to the value of the subsequent PC value in the previous cycle;
   an error detection logic circuit, configured to generate an error detection result according to the multiple flags; and
   an OR gate, coupled to the continuity detection logic circuit and the error detection logic circuit, configured to perform a logic-OR operation on the continuity detection result and the error detection result, to generate the checking result.

3. The logic circuit of claim 2, wherein the multiple flags comprise a branch instruction flag and a branch prediction taken flag, the branch instruction flag indicates whether the current instruction is a branch instruction, and the branch prediction taken flag indicates whether the current instruction is taken to jump to a branch target instruction.

4. The logic circuit of claim 3, wherein when the branch instruction flag indicates that the current instruction is not the branch instruction and the branch prediction taken flag indicates that the current instruction is taken to jump to the branch target instruction, the error detection result indicates that an operation of the branch predictor is abnormal.

5. The logic circuit of claim 4, wherein when the error detection result indicates that the operation of the branch predictor is abnormal, the logic circuit invalidates an entry corresponding to the current PC value in the branch predictor.

6. The logic circuit of claim 3, wherein when the continuity detection result indicates that the value of the current PC value in the current cycle is not identical to the value of the subsequent PC value in the previous cycle, or when the branch instruction flag indicates that the current instruction is not the branch instruction but the branch prediction taken flag indicates that the current instruction is taken to jump to the branch target instruction, the PC value determination circuit selects the value of the subsequent PC value in previous cycle to be a value of the subsequent PC value in a current cycle, to make a subsequent instruction corresponding to the value of the subsequent PC value in the previous cycle be re-executed.

7. The logic circuit of claim 3, wherein when the continuity detection result indicates that the value of the current PC value in the current cycle is identical to the value of the subsequent PC value in the previous cycle, and when the branch instruction flag indicates that the current instruction is the branch instruction or the branch prediction taken flag indicates that the current instruction is not taken to jump to the branch target instruction, the PC value determination circuit selects one of the multiple candidate PC values to be the subsequent PC value further according to multiple event flags.

8. The logic circuit of claim 7, wherein the multiple event flags comprise an exception event flag, a taken branch flag and a PC valid flag, and the multiple candidate PC values comprise a first candidate PC value corresponding to an exception event jump instruction, a second candidate PC value corresponding to the branch target instruction and a third candidate PC value corresponding to a default sequential instruction, wherein the exception event flag, the taken branch flag and the PC valid flag correspond to the first candidate PC value, the second candidate PC value and the third candidate PC value, respectively.

9. A method for checking and updating program counter (PC) values in a pipeline architecture by comparing PC values of consecutive cycles, wherein the method is applicable to a logic circuit, and the method comprises:
utilizing a checking circuit of the logic circuit to check a continuity of a current PC value and multiple flags related to a branch predictor in order to generate a checking result, wherein the branch predictor is configured to control the multiple flags according to the current PC value; and
utilizing a PC value determination circuit of the logic circuit to select one of multiple candidate PC values to be a subsequent PC value according to the checking result;
wherein the current PC value corresponds to a current instruction, and the subsequent PC value corresponds to a subsequent instruction after the current instruction; and wherein the checking circuit checks the continuity of the current PC value by checking whether a value of the current PC value in a current cycle is identical to a value of the subsequent PC value in a previous cycle.

10. The method of claim 9, wherein utilizing the checking circuit of the logic circuit to check the continuity of the current PC value and the multiple flags related to the branch predictor in order to generate the checking result comprises:
utilizing a continuity detection logic circuit of the checking circuit to generate a continuity detection result according to the current PC value and the subsequent PC value, wherein the continuity detection result indicates whether the value of the current PC value in the current cycle is identical to the value of the subsequent PC value in the previous cycle;
utilizing an error detection logic circuit of the checking circuit to generate an error detection result according to the multiple flags; and
utilizing an OR gate of the checking circuit to perform a logic-OR operation on the continuity detection result and the error detection result, to generate the checking result.

11. The method of claim 10, wherein the multiple flags comprise a branch instruction flag and a branch prediction taken flag, the branch instruction flag indicates whether the current instruction is a branch instruction, and the branch prediction taken flag indicates whether the current instruction is taken to jump to a branch target instruction.

12. The method of claim 11, wherein when the branch instruction flag indicates that the current instruction is not the branch instruction and the branch prediction taken flag indicates that the current instruction is taken to jump to the branch target instruction, the error detection result indicates that an operation of the branch predictor is abnormal.

13. The method of claim 12, further comprising:
in response to the error detection result indicating that the operation of the branch predictor is abnormal, invalidating an entry corresponding to the current PC value in the branch predictor.

14. The method of claim 11, wherein utilizing the PC value determination circuit of the logic circuit to select one of the multiple candidate PC values to be the subsequent PC value according to the checking result comprises:
in response to the continuity detection result indicating that the value of the current PC value in the current cycle is not identical to the value of the subsequent PC value in the previous cycle, or in response to the branch instruction flag indicating that the current instruction is not the branch instruction but the branch prediction taken flag indicating that the current instruction is taken to jump to the branch target instruction, selecting the value of the subsequent PC value in the previous cycle to be a value of the subsequent PC value in a current cycle, to make a subsequent instruction corresponding to the value of the subsequent PC value in the previous cycle be re-executed.

15. The method of claim 11, wherein utilizing the PC value determination circuit of the logic circuit to select one of the multiple candidate PC values to be the subsequent PC value according to the checking result comprises:
in response to the continuity detection result indicating that the value of the current PC value in the current cycle is identical to the value of the subsequent PC value in the previous cycle, and in response to the branch instruction flag indicating that the current instruction is the branch instruction or the branch prediction taken flag indicating that the current instruction is not taken to jump to the branch target instruction, selecting one of the multiple candidate PC values to be the subsequent PC value further according to multiple event flags.

16. The method of claim 15, wherein the multiple event flags comprise an exception event flag, a taken branch flag and a PC valid flag, and the multiple candidate PC values comprise a first candidate PC value corresponding to an exception event jump instruction, a second candidate PC value corresponding to the branch target instruction and a third candidate PC value corresponding to a default sequential instruction, wherein the exception event flag, the taken branch flag and the PC valid flag correspond to the first candidate PC value, the second candidate PC value and the third candidate PC value, respectively.

* * * * *